United States Patent
Nathawad (10) Patent No.: US 8,010,072 B1
(45) Date of Patent: Aug. 30, 2011

(54) CHARGE PUMP CURRENT COMPENSATION FOR PHASE-LOCKED LOOP FREQUENCY SYNTHESIZER SYSTEMS

(75) Inventor: Lalitkumar Nathawad, Costa Mesa, CA (US)

(73) Assignee: Atheros Communications, Inc., San Jose, CA (US)

( * ) Notice: Subject to any disclaimer, the term of this patent is extended or adjusted under 35 U.S.C. 154(b) by 570 days.

(21) Appl. No.: 12/141,499

(22) Filed: Jun. 18, 2008

(51) Int. Cl.
*H04B 1/06* (2006.01)
*H04B 7/00* (2006.01)

(52) U.S. Cl. ........ 455/260; 455/254; 455/255; 455/258; 455/259; 455/180.3; 455/182.1; 455/183.1; 331/18; 331/25; 331/34

(58) Field of Classification Search .............. 455/164.1, 455/165.1, 180.3, 182.1, 183.1, 254–260; 331/16–18, 25, 34, 44
See application file for complete search history.

(56) References Cited

U.S. PATENT DOCUMENTS

| | | | | |
|---|---|---|---|---|
| 6,642,799 | B2 * | 11/2003 | Tang | 331/16 |
| 6,774,732 | B1 * | 8/2004 | Harnishfeger et al. | 331/25 |
| 7,177,611 | B2 * | 2/2007 | Goldman | 455/260 |
| 7,323,944 | B2 * | 1/2008 | Florescu et al. | 331/14 |
| 7,375,595 | B2 * | 5/2008 | Serrano et al. | 331/44 |

* cited by examiner

*Primary Examiner* — Tuan A Tran
(74) *Attorney, Agent, or Firm* — Bever, Hoffman & Harms, LLP; Jeanette S. Harms (57) ABSTRACT

A technique for improving frequency synthesizer performance by frequency-compensating charge pump current in order to maintain a consistent loop bandwidth over a wide operating frequency range is described. A relationship between the capacitance value associated with a voltage controlled oscillator resonant tank and the magnitude of current pulses in a related charge pump is exploited to bound the loop bandwidth of the frequency synthesizer over both operating frequency and process variation. A control state machine generates digital coarse tune values that dynamically select a capacitance for the resonant tank, such that the voltage controlled oscillator operates within an optimal control voltage range. Each dynamically selected capacitance value is then used to determine the magnitude of current pulses in the charge pump.

19 Claims, 6 Drawing Sheets

CHARGE PUMP CURRENT COMPENSATION FOR PHASE-LOCKED LOOP FREQUENCY SYNTHESIZER SYSTEMS

BACKGROUND OF THE INVENTION

1. Field of the Invention

Embodiments of the present invention generally relate to synthesized frequency generators, and more specifically to charge pump current compensation for phase-locked loop (PLL) frequency synthesizer systems.

2. Description of the Related Art

Many conventional electronic systems require a plurality of signal sources, each with specific frequency characteristics. In certain systems, at least one signal source may need to generate arbitrary frequencies over a relatively wide range. For example, many radio-frequency (RF) transmission systems are required to operate over the full specified range of a given service band. A specific service band may span tens or even hundreds of megahertz (MHz). Such wide operating frequency ranges typically complicate the design of RF circuits used to construct RF transmission systems. A frequency synthesizer is one common RF circuit that is particularly challenging to construct using monolithic manufacturing processes, such as complementary-symmetry metal-oxide semiconductor (CMOS) fabrication. CMOS circuits are typically subject to relatively wide process variation that impacts important circuit parameters, thereby precluding CMOS frequency synthesizer designs that rely on highly precise or tuned circuit elements.

Figure 1:
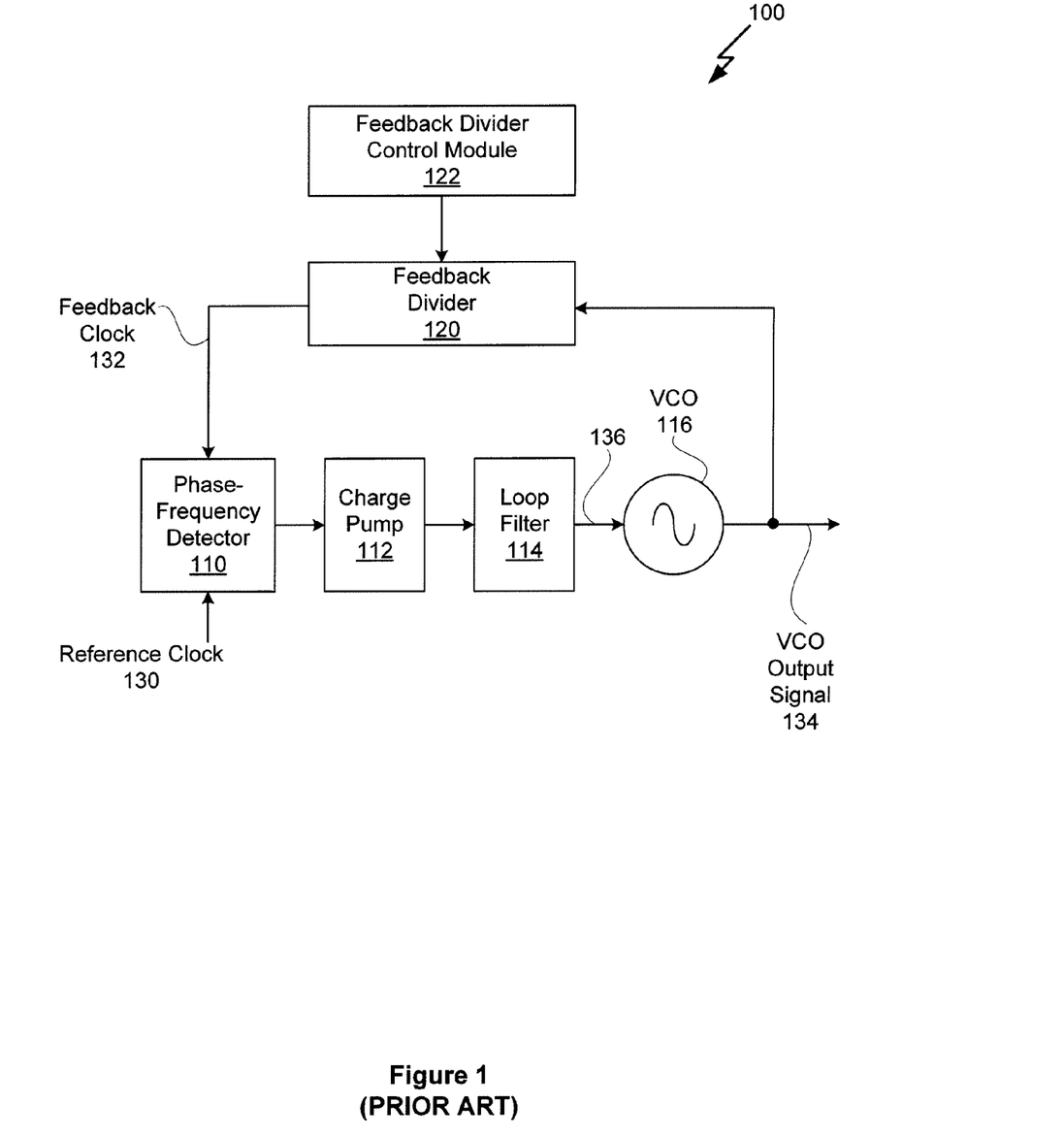
FIG. 1 is a block diagram of a conventional frequency synthesizer.

FIG. 1 is a block diagram of a conventional frequency synthesizer 100. The frequency synthesizer 100 typically incorporates a variable frequency oscillator, such as a voltage controlled oscillator (VCO) 116, and control circuitry configured to form a closed-loop feedback control system, such as a PLL, for controlling the frequency of the VCO 116. The control circuitry conventionally includes a phase-frequency detector (PFD) 110, a charge pump 112, a loop filter 114, a feedback divider 120, and a feedback divider control module 122. The PFD 110 continuously generates an error signal that is proportional to detected phase error between two input signals, such as a feedback clock 132 and a reference clock 130. The charge pump 112 operates on the error signal to generate error pulses, which are transmitted to the loop filter 114. The loop filter 114 integrates the error pulses over time, using a low-pass filter, to generate a VCO control voltage 136. The VCO operates in response to the VCO control voltage 136 to generate an oscillating VCO output signal 134 (the primary output signal of the frequency synthesizer 100) with a frequency that is a function of the VCO control voltage 136. The VCO output signal 134 is transmitted to the feedback divider 120, which generates the feedback clock 132. The feedback clock 132 is transmitted to one input of the PFD 110 for comparison with the reference clock 130, which is coupled to the second input of the PFD 110. Using this architecture, the VCO 116 may be controlled in a closed-loop regime to generate an arbitrary multiple of the reference clock 130.

The VCO 116 is typically required to generate a sine wave with relatively high spectral purity. An inductor-capacitor (LC) resonant tank structure may be used within the VCO 116 to establish the output frequency of the VCO 116. A varactor, or any other appropriate voltage-variable capacitor structure, may be used to tune the resonant frequency of the LC tank structure. The useful capacitance range of a varactor is limited and does not typically provide a sufficient operating frequency range for the VCO 116. To extend the operating range of the VCO 116 to meet the frequency range requirements of a given service band, a digitally controlled variable capacitor structure may be added to the LC tank.

Persons skilled in the art will recognize that as the VCO 116 frequency changes, the loop bandwidth also changes, thereby potentially degrading the overall performance of the frequency synthesizer 100. In other words, the overall performance of the frequency synthesizer 100 may be optimized when the effective loop bandwidth is held to an appropriate constant over the full frequency range of the VCO 116. However, process variation in the circuit elements within the frequency synthesizer 100 introduces sufficiently wide component tolerance values that optimal performance over a wide frequency range is not possible by simply picking optimal component values. Instead, component values are typically selected that attempt to generally satisfy operating requirements over a full operating range. As a result, sub-optimal performance is generally attained within the frequency synthesizer at any specific operating frequency.

As the foregoing illustrates, what is needed in the art is a technique for optimizing performance in frequency synthesizers over both process variation and wide VCO frequency ranges.

SUMMARY OF THE INVENTION

A method of adjusting charge pump current can advantageously compensate for the frequency dependent gain of a VCO and bound the variation in loop bandwidth for a phase-locked loop frequency synthesizer. A current compensation module generates a digital charge pump control signal in response to a digital coarse tune value related to the operating frequency of the frequency synthesizer. The current compensation module multiplies each digital coarse tune value by a first parameter and adds the result to a second parameter to generate the charge pump control signal. The digital charge pump control signal acts to counteract the effect of frequency variation on the loop bandwidth.

The disclosed current compensation module advantageously improves performance of a host frequency synthesizer circuit by essentially nullifying the effect of loop bandwidth variation as the frequency synthesizer operates at varying frequencies.

DETAILED DESCRIPTION

Figure 2A:
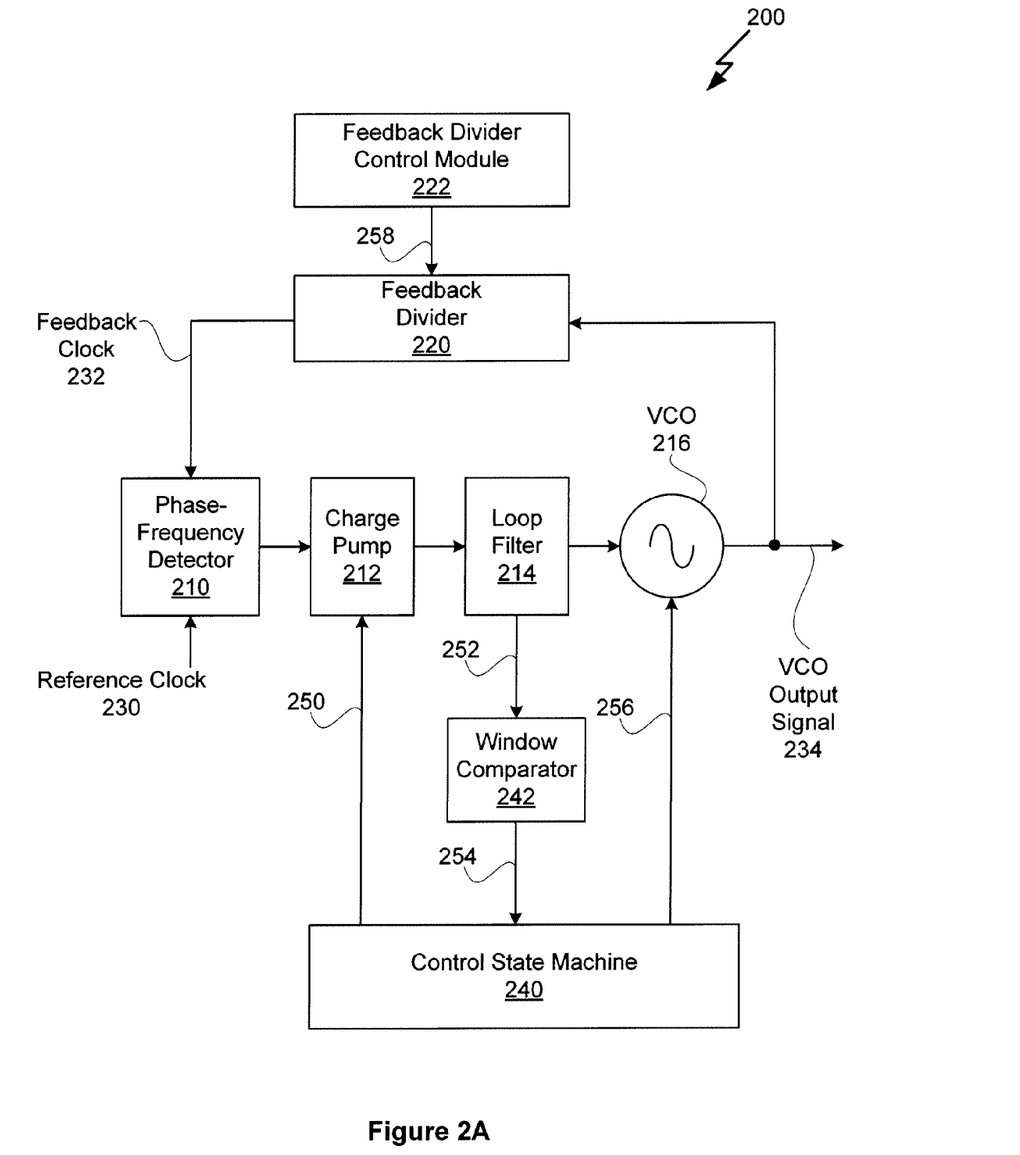
FIG. 2A is a block diagram of a frequency synthesizer including a control state machine that can advantageously compensate for the frequency dependent gain of a VCO and bound the variation in loop bandwidth.

FIG. 2A is a block diagram of a frequency synthesizer 200 including a control state machine that can advantageously compensate for the frequency dependent gain of a VCO and bound the variation in loop bandwidth. The frequency synthesizer 200 includes a phase-frequency detector (PFD) 210, a charge pump (CP) 212, a loop filter (LF) 214, a voltage controlled oscillator (VCO) 216, a feedback divider 220, a feedback divider control module 222, a window comparator 242, and a control state machine 240.

The PFD 210 receives a reference clock 230 and a feedback clock 232 as inputs. The PFD 210 compares the feedback clock 232 input to the reference clock 230 input and generates a phase error signal that represents a detected phase error between the two inputs. For example, the PFD 210 may generate a phase error signal including phase error pulses that are proportional in pulse-width to the detected phase error. The reference clock 230 should be stable and accurate with respect to oscillation frequency. The reference clock 230 may be generated using any technically feasible means, such as a crystal oscillator.

The PFD 210 transmits the phase error signal to the CP 212, which generates corresponding controlled-current pulses. In one embodiment, the CP 212 uses a switched current source circuit to generate the controlled-current pulses. The magnitude of energy transmitted in each of the controlled-current pulses is determined by a charge pump control signal 250. The charge pump control signal 250 may be a digital value of one or more bits. In one embodiment, the charge pump control signal 250 includes three bits used to represent one of eight values of total energy to be transferred per controlled-current pulse. The total energy to be transferred per controlled-current pulse may be determined by pulse magnitude, pulse duration, or a combination thereof. Each controlled-current pulse may either source or sink charge from LF 214, based on sign of the phase error signal generated by the PFD 210. In one embodiment, the CP 212 may include circuitry to provide a certain minimum current per controlled-current pulse regardless of the value of the charge pump control signal 250.

The controlled-current pulses are filtered by the LF 214 to generate a VCO control voltage that represents a low-pass filtered, time-averaged function of the controlled-current pulses. Any technically feasible filter structure may be used for the loop filter, including a variety of well known low-pass resistor-capacitor networks. The VCO control voltage generated by the loop filter 214 is transmitted to the VCO 216.

The VCO 216 generates a VCO output signal 234, which is periodic and proportional in frequency to the VCO control voltage. In one embodiment, the VCO output signal 234 is a sinusoidal wave with high spectral purity. The VCO output signal 234 may be represented by a differential electrical signal or a single-ended electrical signal, or any other technically feasible signal representation. The VCO output signal 234, also referred to as the "output signal," is the primary output signal generated by the frequency synthesizer 200. The output signal is characterized by oscillation at a desired frequency. A coarse tune value 256 is transmitted from the control state machine 240 to the VCO 216. The coarse tune value 256 establishes a coarse frequency range in which the VCO 216 may operate. The VCO control voltage provides fine tuning control of the VCO output frequency. The coarse tune value 256 may be a digital value of one or more bits.

The VCO output signal 234 is transmitted to the feedback divider 220, which divides the VCO output signal 234 by a number of counts specified by feedback count 258. The feedback divider 220 generates the feedback clock 232, having an average frequency corresponding to an average frequency of the VCO output signal 234 divided by an average of feedback count 258 values. In one embodiment, the feedback divider 220 generates a single pulse at the conclusion of each set of divider count cycles, specified by feedback count 258. The single pulse may substantially correspond to the width of one or more cycles of the VCO output signal 234. At the conclusion of each set of divider count cycles, a new feedback count 258 is established in the feedback divider 220 to define a subsequent set of divider count cycles. In one embodiment, the feedback divider 220 incorporates two or more stages of counters, where each of the two or more stages of counters may receive a portion of the overall feedback count 258. Each portion of the feedback count 258 may be updated independently, as appropriate for a given implementation.

A closed control loop is formed by feeding back the feedback clock 232 to the PFD 210 for comparison against the reference clock 230. The parameter being controlled, by negative feedback in the control loop, is the average frequency of the VCO 216, which is locked to a frequency given by the frequency of the reference clock 230 multiplied by a time average of the values of feedback count 258.

The feedback divider control module 222 is configured to generate sequential values of feedback count 258, as appropriate to achieve a specified frequency in the VCO output signal 234. The feedback divider control module 222 may incorporate, for example, a sigma-delta modulator that modulates the feedback count 258 to provide precise, high-resolution control of the frequency of the VCO output signal 234.

A window comparator 242 receives a control voltage 252 from the LF 214. The control voltage 252 is a filtered average of the VCO control voltage. The instantaneous direct current (DC) value of the control voltage 252 corresponds to the average VCO control voltage that is applied to a voltage-variable capacitor structure (e.g., a varactor) within the VCO 216. The capacitance of the varactor varies according to the VCO control voltage. The varactor is coupled to an inductor, thereby forming a resonant LC tank structure with a resonant frequency that is determined by the VCO control voltage. The maximum available variation in varactor capacitance over the complete range of the VCO control voltage is typically limited, thereby limiting the maximum excursion in the VCO frequency. A bank of additional fixed capacitors within the VCO 216 may be added in parallel with the varactor to extend the range of the resonant LC tank structure beyond the range attainable using only a varactor.

The window comparator 242 generates an operating point signal 254 that reports whether the VCO control voltage is, on average, lower than a specified low threshold, higher than a specified high threshold, or centered between the two specified thresholds. Optimal operation in VCO 216 occurs when the VCO control voltage is centered between the low threshold and the high threshold.

The control state machine 240 is configured to select an appropriate coarse tune value 256, such that the resulting operating point signal 254 is centered between the low threshold and high threshold. A new coarse tune value 256 should be established each time a new operating frequency is set for the frequency synthesizer 200. In one embodiment, the control state machine 240 implements a binary search to find an appropriate coarse tune value 256 that selects an appropriate set of fixed capacitors to add to the resonant LC tank, such that the control voltage driving the varactor is centered between the low threshold and the high threshold, as determined by the window comparator 242. Notably, the control state machine 240 is able to establish an appropriate coarse tune value 256 without regard to normal process variation. In fact, the only precise parameter required by the frequency synthesizer 200 is the reference clock 230, which may be generated by a precision external reference, such as an external quartz crystal.

Persons skilled in the art will recognize that the loop bandwidth of the frequency synthesizer 200 changes as a function of the VCO frequency, as shown below in Equations 1 through 3. However, changes in the loop bandwidth are detrimental to the overall performance of the frequency synthesizer 200 and should be minimized for optimal performance. As shown in Equation 1, the loop bandwidth (LoopBW) of the frequency synthesizer 200 is proportional to VCO gain (Kv) multiplied by charge pump current (Ip), divided by the divider ratio (M). As shown in Equation 2, the VCO gain (Kv) is proportional to the VCO frequency (Fvco) cubed. Equation 3 defines the divider ratio (M) as the VCO frequency (Fvco) divided by the reference frequency (Fref).

$$LoopBW \propto \left(\frac{Kv \cdot Ip}{M}\right) \quad \text{(Equation 1)}$$

$$Kv \propto (Fvco)^3 \quad \text{(Equation 2)}$$

$$M = \frac{Fvco}{Fref} \quad \text{(Equation 3)}$$

Combining Equations 1, 2 and 3, the loop bandwidth (LoopBW) is shown in Equation 4 to be proportional to the charge pump current (Ip) multiplied by the VCO frequency (Fvco) squared.

$$LoopBW \propto \frac{Kv \cdot Ip}{Fvco} \propto Ip \cdot (Fvco)^{\wedge}2 \quad \text{(Equation 4)}$$

To optimize performance in the frequency synthesizer 200, the relationship between charge pump current (Ip) and VCO frequency (Fvco) may be exploited to minimize changes in loop bandwidth (LoopBW), even as the VCO frequency changes. By modifying the charge pump current in proportion to the reciprocal of the square of the VCO frequency, the loop bandwidth (LoopBW) may be held relatively constant. A frequency-compensated charge pump current (Ipc) is specified by the charge pump control signal 250, which may be generated by the control state machine 240 and transmitted to the charge pump 212. One technique for computing the frequency-compensated charge pump current (Ipc) is specified in Equations 5 through 7.

Equation 5 shows the well known relationship between resonant tank inductance (Lt), resonant tank capacitance (Ct), and the resulting resonant tank frequency, which is the VCO frequency (Fvco).

$$(Fvco)^{\wedge}2 = \left(\frac{1}{2\pi}\right)^2 \frac{1}{Lt \cdot Ct} \quad \text{(Equation 5)}$$

By combining Equations 4 and 5, the frequency-compensated charge pump current (Ipc) is shown in Equation 6 to be proportional to the resonant tank capacitance (Ct).

$$Ipc \propto \frac{1}{(Fvco)^{\wedge}2} \propto Ct \quad \text{(Equation 6)}$$

The resonant tank capacitance (Ct) may be comprised of two components: 1) a fixed component due to device capacitance, circuit layout coupling capacitance and other physical affects ($Ct_0$) and 2) a variable component that is used to tune the VCO frequency (i.e. capacitance used in the coarse tuning switched capacitor circuits and the varactor capacitance). This is illustrated in Equation 7, where K is a slope parameter, VCOCap is a switched capacitor setting and Cvar is the varactor capacitance.

$$Ct = Ct_0 + K \cdot VCOCap + Cvar \quad \text{(Equation 7)}$$

Using the relationships shown in Equation 6 and Equation 7, the frequency-compensated charge pump current (Ipc) may be computed using Equation 8, where a charge pump current slope (SlopeIp) and an offset current (Ip0) collectively map the VCO switched capacitor setting (VCOCap) to an appropriate frequency-compensated charge pump current (Ipc). The variation in capacitor Cvar with VCO frequency is assumed to be small and has been neglected. As shown in Equation 8, the charge pump current slope parameter (SlopeIp) is multiplied by the VCO switched capacitor setting (VCOCap). The resulting product is then added to the offset current parameter (Ip0), which sets a minimum operating current for the charge pump. Persons skilled in the art will recognize that the computation expressed in Equation 7 may be performed using variables of arbitrary digital precision using direct mathematical computation, using one or more look up tables, or through any other technically feasible means. The resulting value of the frequency-compensated charge pump current (Ipc) may be of any appropriate precision and may include one or more digital bits that collectively form a digital charge pump control signal.

$$Ipc = SlopeIp \cdot VCOCap + Ip0 \quad \text{(Equation 8)}$$

Figure 2B:
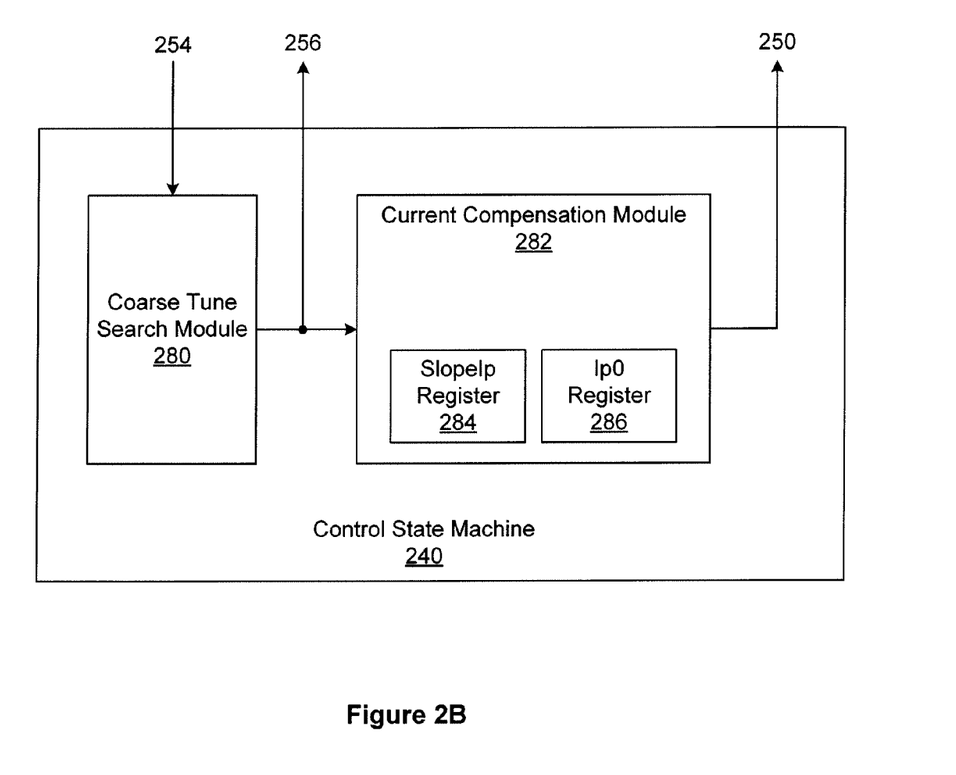
FIG. 2B is a block diagram of control state machine components configured to compute a frequency-compensated charge pump current.

FIG. 2B is a block diagram of control state machine 240 components configured to compute a frequency-compensated charge pump current (Ipc). The control state machine 240 includes, without limitation, coarse tune search module 280 and current compensation module 282.

The coarse tune search module 280 implements a search algorithm that determines an optimal resonant tank capacitance (Ct), such that the VCO control voltage is centered between the high threshold and the low threshold, as reported by the operating point signal 254. The coarse tune search module 280 may generate a sequence of coarse tune values 256 and respond to the resulting operating point signal 254 in order to find an appropriate coarse tune value 256 for a desired operating frequency of the VCO 216. Any technically feasible search algorithm, such as a binary search, may be used in determining the specific search sequence followed by the coarse tune search module 280. Persons skilled in the art will recognize that the coarse tune search logic may implement the respective search algorithm directly in hardware or using any combination of hardware and software. In one embodiment, the coarse tune search module 280 implements a binary search algorithm using a state machine implemented directly in hardware. In an alternative embodiment, the binary search algorithm is implemented in software.

The coarse tune values 256 are transmitted to the current compensation module 282, which implements Equation 7 to compute a frequency-compensated charge pump current (Ipc). The computed frequency-compensated charge pump current (Ipc) is transmitted from the current compensation module 282 as the charge pump control signal 250. The current compensation module 282 includes a SlopeIp register 284, and an Ip0 register 286. The SlopeIp register 284 corresponds to the charge pump current slope (SlopeIp) parameter of Equation 7. The Ip0 register 286 corresponds to the offset current parameter (Ip0) of Equation 7. The SlopeIp register 284 and the Ip0 register 286 may be configured through any technically feasible means and may include any appropriate number of bits to properly represent a corresponding value. For example, the SlopeIp register 284 may be configured to be programmable and may be programmed with a value or an indexed value. Alternately, the SlopeIp register 284 may be configured not to be programmable and may instead be assigned a permanent value. Similarly, the Ip0 register 286 may be configured to be programmable and may be programmed with a value or an indexed value. Alternately, the SlopeIp register 286 may be configured not to be programmable and may be assigned a permanent value.

In one embodiment, the current compensation module 282 is implemented directly using logic circuitry, such as a multiplier and an adder. In an alternative embodiment, the current compensation module 282 is implemented using a lookup table, which may be constructed using logic gates or a memory structure (e.g. a static random access memory (SRAM), read only memory (ROM), or any combination thereof). In another alternative embodiment, the current compensation module 282 is implemented in software.

Figure 3:
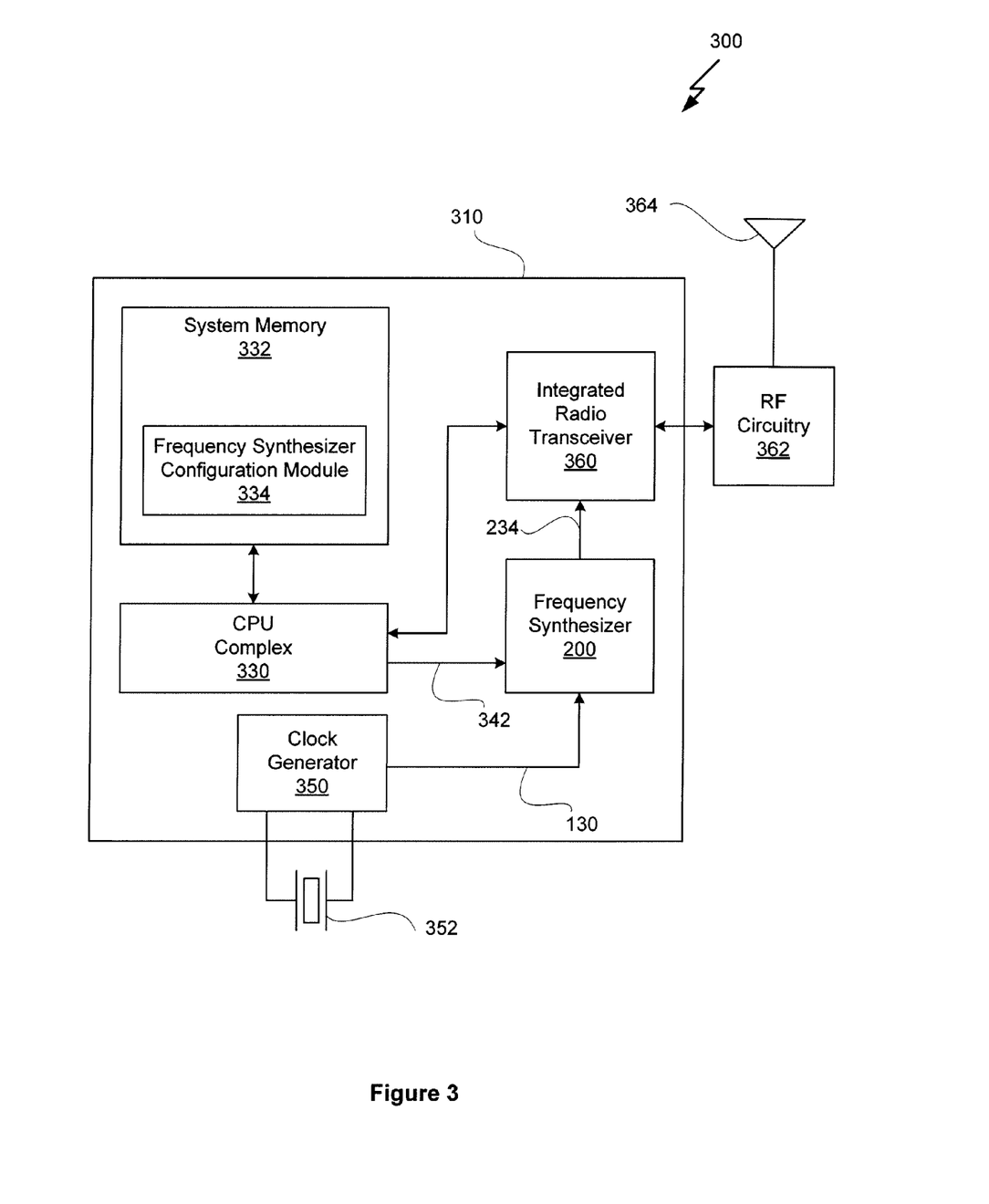
FIG. 3 is a block diagram of a radio-frequency communications subsystem including the frequency synthesizer of FIG. 2.

FIG. 3 is a block diagram of a radio-frequency (RF) communications subsystem 300 including the frequency synthesizer of FIG. 2A, an integrated radio chip 310, an antenna 364, RF circuitry 362, and a resonator 352. The resonator 352 may be a quartz crystal, ceramic resonator, external oscillator, or any technically feasible combination of components configured to provide a stable, accurate frequency reference. The RF circuitry 362 provides any filtering, impedance matching, amplification or other signal processing needed to effectively couple the integrated radio chip 310 to the antenna 364. The antenna 364 may be any technically feasible structure configured to transmit and receive electromagnetic RF signals.

The integrated radio chip 310 includes a central processing unit (CPU) complex 330, a system memory 332, a clock generator 350, the above-described frequency synthesizer 200, and an integrated radio transceiver 360. The CPU complex 330 includes at least one CPU configured to interface with the system memory 332 in order to read and write data (including programming instructions) stored in the system memory 332. The CPU complex 330 may also include any technically appropriate interface circuitry used to interoperate with other circuitry incorporated in the integrated radio chip 310. For example, the CPU complex 330 can include interface circuitry for controlling an interface bus 342 and for writing registers in the frequency synthesizer 200. More specifically, the interface bus 342 may be configured to write the SlopeIp register 284 and the Ip0 register 286 within the frequency synthesizer 200, thereby establishing a mapping from the coarse tune value 256 to the frequency-compensated charge pump current (Ipc), which defines the charge pump control signal 250. The values written into the SlopeIp register 284 and the Ip0 register 286 may be computed through simulation, lab measurements, or any other technically feasible technique.

The system memory 332 includes a frequency synthesizer configuration module 334 configured to compute one or more parameters used by the frequency synthesizer 200 to establish an operating frequency.

The clock generator 350 is configured to interact with resonator 352 to produce reference clock 230. For example, clock generator 350 may be configured to cause a quartz crystal to oscillate and produce a stable, accurate frequency reference signal that may be amplified to generate reference clock 230.

The integrated radio transceiver 360 incorporates signal-processing circuitry used to transmit and receive RF signals. The integrated radio transceiver 360 may also incorporate digital modulator/de-modulator circuitry for transmitting and receiving digital data streams. The circuits within the integrated radio transceiver 360 typically require one or more frequency reference signals. Each reference signal should be established at a specified frequency, whereby the specified frequency may change during the coarse of normal operation. The frequency synthesizer 200 is configured to provide a frequency reference signal, such as VCO output signal 234, to the integrated radio transceiver 360.

Figure 4A:
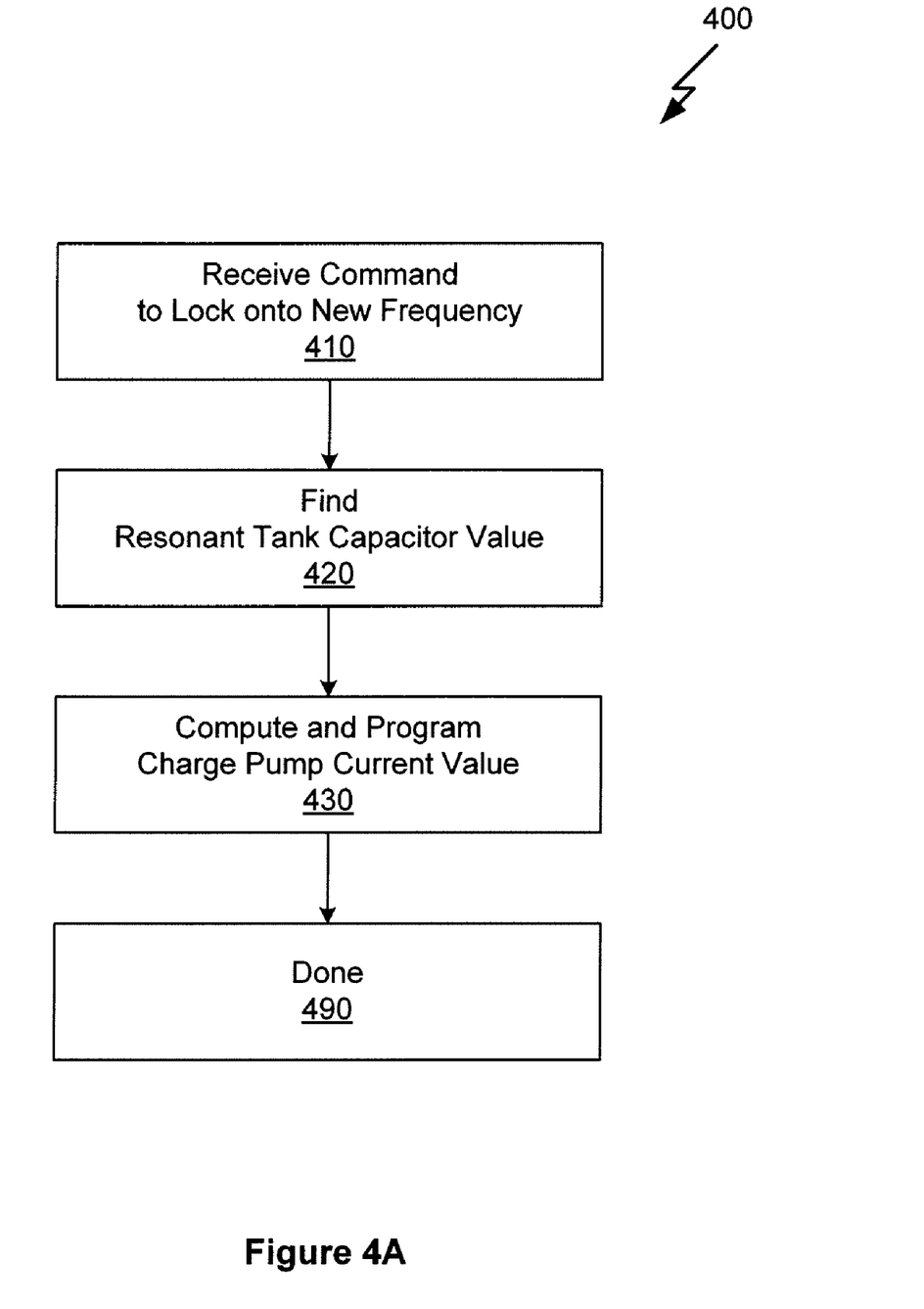
FIG. 4A is a first flow diagram of a method for computing a frequency-compensated charge pump current.

FIG. 4A is a first flow diagram of a method 400 for computing a frequency-compensated charge pump current. Although the method 400 is described in conjunction with the systems of FIGS. 2A, 2B and 3, persons skilled in the art will understand that any system that performs the steps in method 400, in any order, is within the scope of the invention.

In step 410, the frequency synthesizer 200 receives a command to lock onto a new frequency. The command may be explicit or implicit. An example of an implicit command is a write operation to a certain register. In step 420, the coarse tune module 280 (FIG. 2B) finds a resonant tank capacitor value that centers the VCO control voltage between the high threshold and the low threshold.

In step 430, the current compensation module 282 computes a frequency-compensated charge pump current and programs the charge pump with this value via the charge pump control signal 250. The frequency-compensated charge pump current is computed according to Equation 7. The method 400 terminates in step 490.

Figure 4B:
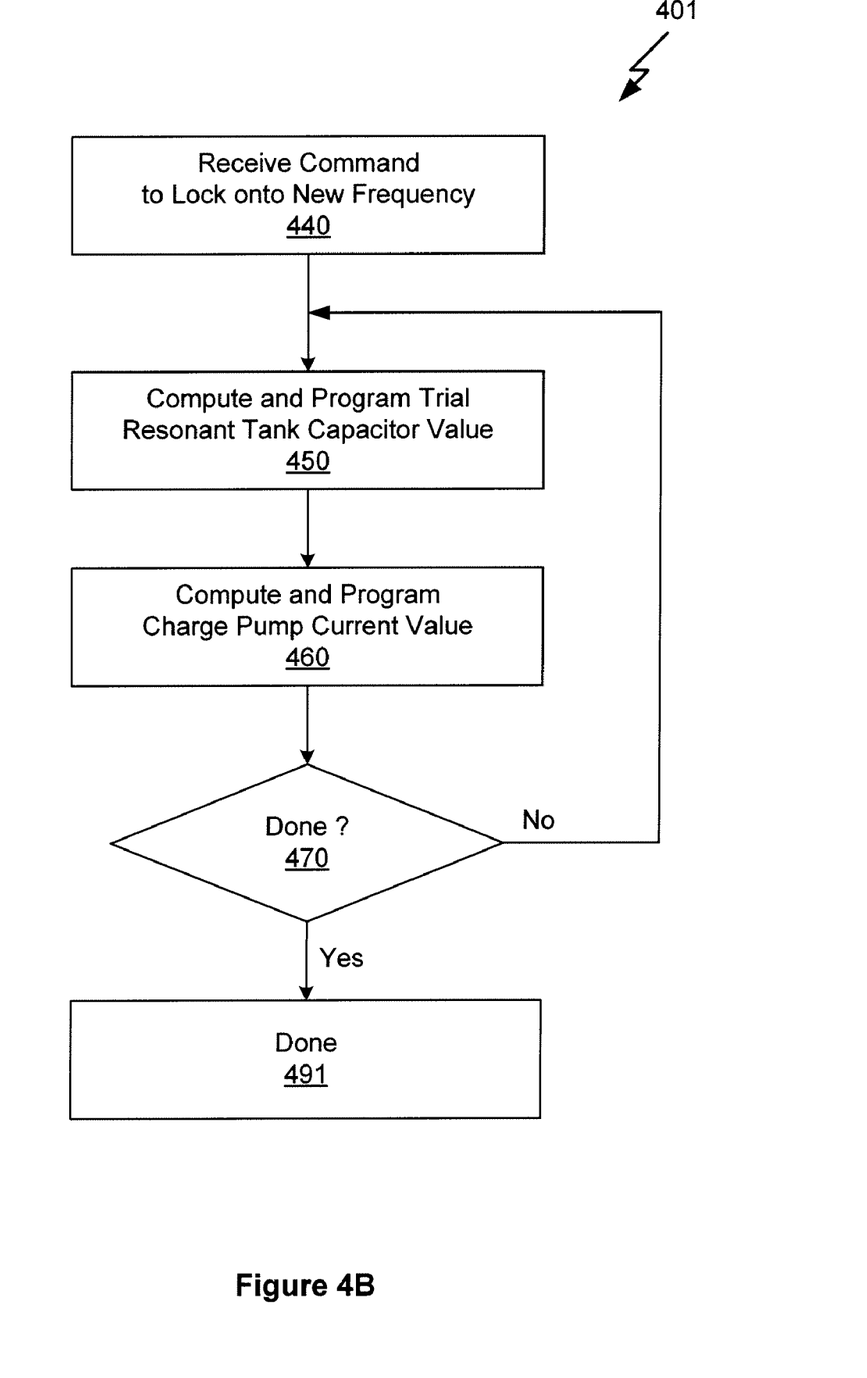
FIG. 4B is a second flow diagram of a method for computing a frequency-compensated charge pump current.

FIG. 4B is a second flow diagram of a method 401 for computing a frequency-compensated charge pump current. Although the method 401 is described in conjunction with the systems of FIGS. 2A, 2B and 3, persons skilled in the art will understand that any system that performs the steps of method 401, in any order, is within the scope of the invention.

In step 440, the frequency synthesizer 200 receives a command to lock onto a new frequency. The command may be explicit or implicit. An example of an implicit command is a write operation to a certain register.

In step 450, the coarse tune module 280 (FIG. 2B) computes and programs a trial resonant tank capacitor value into the VCO 216 (FIG. 2A). Each sequential trial resonant tank capacitor value is computed according to a specific search algorithm, such as a binary search algorithm. In step 460, the current compensation module 282 computes a frequency-compensated charge pump current and programs the charge pump with this value via the charge pump control signal 250. The frequency-compensated charge pump current is computed according to Equation 7. If, in step 470, the search process performed by the coarse tune module 240 is complete, as indicated by the VCO control voltage being between the high threshold and the low threshold, the method 401 terminates in step 490.

Returning to step 470, if the search process performed by the coarse tune module 280 is not complete, as indicated by the VCO control voltage being above the high threshold or below the low threshold, then the method 401 proceeds to step 450.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A circuit for generating an oscillating signal, the circuit comprising:
   a coarse tune search module configured to generate a sequence of one or more digital coarse tune values in response to an operating point signal; and
   a current compensation module configured to generate a digital charge pump control signal in response to the one or more digital coarse tune values, wherein the digital charge pump control signal is proportional to the one or more digital coarse tune values multiplied by a first parameter and added to second parameter.

2. The circuit of claim 1, wherein the sequence of the one or more digital coarse tune values comprises a binary search.

3. The circuit of claim 1, wherein the first parameter is stored in a programmable register.

4. The circuit of claim 1, wherein the second parameter is stored in a programmable register.

5. The circuit of claim 1, wherein the digital charge pump control signal includes at least one bit.

6. The circuit of claim 1, wherein the digital charge pump control signal is computed using direct mathematical computation.

7. The circuit of claim 1, further comprising a window comparator configured to generate the operating point signal, wherein the operating point signal indicates when an input voltage is above a high threshold, or below a low threshold.

8. The circuit of claim 7, further comprising a window comparator configured to generate the operating point signal, wherein the operating point signal indicates when an input voltage is between a high threshold and a low threshold.

9. The circuit of claim 8, further comprising:
   a voltage controlled oscillator, configured to generate a sinusoidal output signal in response to a control voltage;
   a loop filter, configured to generate a control voltage by applying a low pass filter to a sequence of current-controlled pulses;
   a charge pump, configured to generate the sequence of current-controlled pulses in response to a phase error signal;
   a phase detector, configured to generate the phase error signal by comparing a reference clock to a feedback clock;
   a feedback divider, configured to generate the feedback clock by dividing the sinusoidal output signal according to a feedback count; and
   a feedback divider control module, configured to generate the feedback count according to a specified frequency.

10. The circuit of claim 9, wherein the sinusoidal output signal is represented by a differential electrical signal.

11. The circuit of claim 9, wherein the feedback divider control module incorporates a sigma-delta modulator, configured to modulate the feedback count.

12. The circuit of claim 9, wherein the charge pump is configured to provide at least a specified minimum current per controlled-current pulse, irrespective of the charge pump control signal.

13. A radio-frequency communications subsystem, the subsystem comprising:
   an antenna configured to send and receive radio-frequency electromagnetic signals;
   a radio-frequency circuit coupled to the antenna and configured to provide impedance matching;
   a resonator configured to provide a frequency reference signal; and
   an integrated radio chip coupled to the radio-frequency circuit and to the resonator, the chip comprising:
      a system memory, configured to store programming instructions and data,
      a central processing unit complex, configured to program circuitry within the integrated radio chip,
      a clock generator, configured to generate a reference clock signal,
      an integrated radio transceiver circuit, configured to transmit and receive radio-frequency electrical signals, and
      a frequency synthesizer, coupled to the clock generator and to the integrated radio transceiver circuit, wherein the frequency synthesizer incorporates a window comparator configured to generate an operating point signal, and a circuit for generating a digital charge pump control signal, the circuit comprising: a coarse tune search module configured to generate a sequence of one or more digital coarse tune values in response to the operating point signal, and a current compensation module configured to generate a digital charge pump control signal in response to the one or more digital coarse tune values, wherein the digital charge pump control signal is proportional to the one or more digital coarse tune values multiplied by a first parameter and added to second parameter.

14. The subsystem of claim 13, wherein the first parameter is stored in a programmable register.

15. The subsystem of claim 13, wherein the second parameter is stored in a programmable register.

16. A non-transitory, computer-readable medium including instructions that, when executed by a processing unit, cause the processing unit to compute a frequency-compensated charge pump current, by performing the steps of:
   receiving a command to lock a frequency synthesizer to a new frequency;
   computing and programming a resonant tank capacitor value; and
   computing and programming a charge pump current value, wherein the charge pump current value is proportional to the one or more digital coarse tune values multiplied by a first parameter and added to a second parameter.

17. The computer-readable medium of claim 16, wherein the step of computing and programming the resonant tank capacitor value comprises a binary search.

18. The computer-readable medium of claim 17, further comprising the step of determining if the resonant tank capacitor value needs to be re-computed.

19. The computer-readable medium of claim 18, wherein the step of determining if the resonant tank capacitor value needs to be re-computed is determined by a control voltage level.

* * * * *